(12) United States Patent
Bhushan et al.

(10) Patent No.: US 12,424,590 B2
(45) Date of Patent: Sep. 23, 2025

(54) SEMICONDUCTOR DEVICE ASSEMBLIES AND ASSOCIATED METHODS

(71) Applicant: Micron Technology, Inc., Boise, ID (US)

(72) Inventors: Bharat Bhushan, Taichung (TW); Akshay N. Singh, Boise, ID (US); Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 636 days.

(21) Appl. No.: 17/857,304

(22) Filed: Jul. 5, 2022

(65) Prior Publication Data

US 2024/0014170 A1 Jan. 11, 2024

(51) Int. Cl.
*H01L 25/065* (2023.01)
*H01L 23/00* (2006.01)
(Continued)

(52) U.S. Cl.
CPC .......... *H01L 25/0652* (2013.01); *H01L 24/05* (2013.01); *H01L 24/06* (2013.01); *H01L 24/08* (2013.01); *H01L 25/18* (2013.01); *H01L 25/50* (2013.01); *H01L 24/16* (2013.01); *H01L 24/32* (2013.01); *H01L 24/73* (2013.01); *H01L 24/92* (2013.01); *H01L 24/96* (2013.01); *H01L 2224/0557* (2013.01); *H01L 2224/06181* (2013.01); *H01L 2224/08145* (2013.01);
(Continued)

(58) Field of Classification Search
CPC ... H01L 2224/0557; H01L 2224/06181; H01L 2224/08145; H01L 2224/16225; H01L 2224/32225; H01L 2224/73204; H01L 2224/92125; H01L 2224/9222; H01L 2224/96; H01L 2225/06517; H01L 2225/06541; H01L 24/05; H01L 24/06; H01L 24/08; H01L 24/16; H01L 24/17; H01L 24/32; H01L 24/73; H01L 24/92; H01L 24/96; H01L 25/0652; H01L 25/0657; H01L 25/18; H01L 25/50
See application file for complete search history.

(56) References Cited

U.S. PATENT DOCUMENTS 8,947,931 B1 * 2/2015 D'Abreu ............. H01L 25/0652
365/185.11
10,319,699 B2 * 6/2019 Wei ........................ H01L 24/03
(Continued)

*Primary Examiner* — Telly D Green
(74) *Attorney, Agent, or Firm* — Dorsey & Whitney LLP

(57) ABSTRACT

A semiconductor device assembly can include an assembly substrate having a top surface, a top semiconductor device having a bottom surface, and a plurality of intermediary semiconductor devices. Each of intermediary semiconductor device can be bonded to both the assembly substrate top surface and the top device bottom surface. Each intermediary semiconductor device can also include a semiconductor substrate, a memory array, a first bond pad, a second bond pad, and a conductive column. The first bond pad can electrically couple the assembly substrate to the intermediary semiconductor device; the second bond pad can electrically couple the top semiconductor device to the intermediary semiconductor device; and the conductive column can electrically couple the first bond pad to the second bond pad, and can be exclusive of any electrical connection to the memory array.

20 Claims, 12 Drawing Sheets

(51) Int. Cl.
*H01L 25/00* (2006.01)
*H01L 25/18* (2023.01)
(52) U.S. Cl.
CPC .............. *H01L 2224/16225* (2013.01); *H01L 2224/32225* (2013.01); *H01L 2224/73204* (2013.01); *H01L 2224/92125* (2013.01); *H01L 2224/9222* (2013.01); *H01L 2224/96* (2013.01)

(56) References Cited

U.S. PATENT DOCUMENTS

| | | | |
|---|---|---|---|
| 2003/0209791 A1* | 11/2003 | Akram | H01L 25/0657 |
| | | | 257/E29.022 |
| 2018/0006006 A1* | 1/2018 | Kim | H01L 25/50 |
| 2018/0254260 A1* | 9/2018 | Wei | H01L 25/0652 |
| 2019/0244946 A1* | 8/2019 | Kim | H01L 23/552 |
| 2019/0259743 A1* | 8/2019 | Han | H01L 25/0657 |
| 2020/0335479 A1* | 10/2020 | Li | H01L 21/6836 |
| 2020/0343218 A1* | 10/2020 | Hu | H01L 24/80 |
| 2021/0143126 A1* | 5/2021 | Choi | H01L 25/0652 |
| 2022/0310570 A1* | 9/2022 | Chang | H01L 24/09 |

\* cited by examiner

1100

1102
Form a plurality of intermediary semiconductor devices

1104
Bond each of the intermediary semiconductor devices directly to a top semiconductor device 1106
Provide a mold material between the intermediary semiconductor devices 1108
Bond an assembly substrate to the plurality of intermediary semiconductor devices 1110
Provide an underfill material between the intermediary semiconductor devices and the assembly substrate 1112
Provide a mold material over the intermediary semiconductor devices and the top semiconductor device 1114
Form solder balls on the assembly substrate

*FIG. 11*

SEMICONDUCTOR DEVICE ASSEMBLIES AND ASSOCIATED METHODS

TECHNICAL FIELD

The present technology is generally related to semiconductor device assemblies. In particular, the present technology relates to semiconductor devices in direct electric communications with an assembly substrate through other semiconductor devices.

BACKGROUND

Microelectronic devices, such as memory devices and microprocessors, and other electronics typically include one or more semiconductor devices and/or components attached to a substrate and encased in a protective covering. The devices and/or components include at least one functional features, such as memory cells, processor circuits, and interconnecting circuitry, etc. Each device and/or component commonly includes an array of small bond pads electrically coupled to the functional features therein for interconnection with other devices and/or components. Manufacturers are under increasing pressure to reduce the space occupied by these devices and components while simultaneously increasing the capacity and/or speed of operation for the resulting semiconductor assemblies.

Manufacturers face particular challenges regarding semiconductor devices intended for processing applications. Processing devices require interconnections with many devices within a semiconductor assembly for completing processing tasks. For example, regarding device interconnections, processing devices require links with memory devices, I/O connections, process-specific devices (i.e., video and/or audio processing), and other similar devices. Processing devices also require a relatively significant power supplies, resulting in high heat production. Manufacturers therefore struggle to combine all the necessary components required by a processing device in a compact assembly while also providing sufficient power without exposing elements of the assembly to excessive heat generated thereby.

BRIEF DESCRIPTION OF THE DRAWINGS

FIG. 11 is a flow diagram illustrating a process for producing at least the semiconductor device assembly of FIG. 1, in accordance with some embodiments of the present technology.

Figure 1:
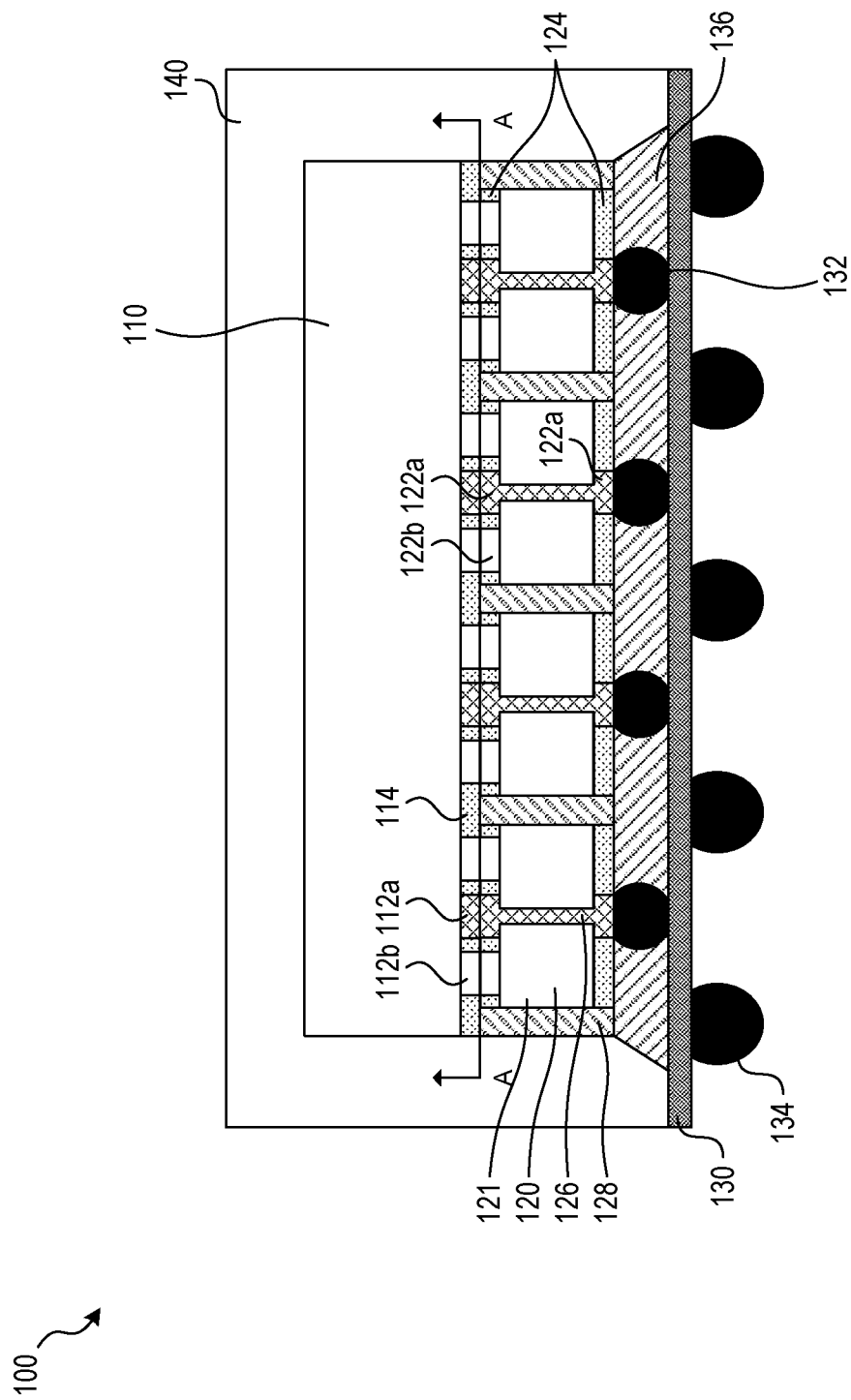
FIG. 1 is a cross sectional side view of a semiconductor device assembly, configured in accordance with some embodiments of the present technology.

The drawings have not necessarily been drawn to scale. Similarly, some components or operations can be separated into different components or combined into a single assembly in some implementations of the present technology. While the technology is amenable to various modifications and alternative forms, specific implementations have been shown by way of example in the drawings and are described in detail below.

DETAILED DESCRIPTION

The assemblies and associated methods of the present technology relate to semiconductor device assemblies with processing devices (e.g., top devices) above other semiconductor devices and in direct electric communications with an assembly substrate through the other semiconductor devices, improving at least semiconductor packages. The assemblies and methods of the present technology allow processing devices and process-supporting devices traditionally spaced laterally adjacent to one another to be stacked vertically, reducing the necessary assembly footprint and materials dedicated to interconnections between the processing devices and process-supporting devices. For example, the present technology can be applied in at least applications where a central processing device (e.g., a central processing unit, a graphics processing unit, or any similar device) requiring process-supporting devices (e.g., memory dies or other similar semiconductor devices with internal electronic components) is used in larger systems (e.g., computing devices, hand-held devices, computers, vehicles, appliances, and other products) where component space is limited on an underlying system board.

As examples of traditional devices, one first type includes a processing device (e.g., a graphics processing unit) coupled to a PCB with multiple process-supporting devices (e.g., memory dies) each also coupled to the PCB and laterally spaced from the processing device. These traditional devices require a significant PCB footprint, both on the surface of the PCB and by wire traces within the PCB. A second type of traditional device includes a semiconductor package with a processing device coupled to a package substrate. The second type also includes a stack of process-supporting devices coupled to the package substrate and laterally spaced from the processing device. The semiconductor package can then be coupled to a PCB. Although requiring a smaller footprint than the first type, this second type still requires a significant PCB footprint and number of wire traces through the package substrate.

Aspects of stacking intermediary devices under the top device of the device assembly provides many benefits over at least these traditional device types. For example, the footprint of the device assembly can be reduced by 10%, 25%, 33%, 50%, or more in comparison to the first and second traditional device types. Further, in some embodiments, the height of the device assembly can also be reduced in comparison to the second traditional device type. The height can be reduced at least because process-supporting devices can be included as multiple single dies, or multiple die stacks, between the processing device and a device assembly substrate, as opposed to tall die stacks laterally adjacent to the processing device. As an illustrative example of these benefits between: the first type may include a processing device and eight process-supporting devices laterally spaced therefrom, the second type may include a processing device with a stack of eight (or two stacks of four, etc.) process-supporting devices laterally therefrom, and embodiments of the present technology may include a processing device with the eight process-supporting dies under the processing device and spread throughout a bottom surface of the processing device.

Additional benefits of the present technology can include, for example, (i) improving signaling between the intermediary devices and the top device at least by reducing signaling distances, (ii) reducing material costs and assembly package size by removing unnecessary interposer or logic boards and the trace material therein, and (iii) further separating the top device, and the heat generated thereby, from the assembly substrate, any components at the assembly substrate, and any components adjacent to the assembly.

In some embodiments, a semiconductor device assembly can include an assembly substrate having a top surface, a top semiconductor device having a bottom surface, and a plurality of intermediary semiconductor devices. Each of intermediary semiconductor device can be bonded to both the assembly substrate top surface and the top device bottom surface. Each intermediary semiconductor device can also include a memory array, a first bond pad, a second bond pad, and a conductive column. The first bond pad can electrically couple the assembly substrate to the intermediary semiconductor device; the second bond pad can electrically couple the top semiconductor device to the intermediary semiconductor device; and the conductive column can extend from and electrically couple the first bond pad to the second bond pad, and can be exclusive of any electrical connection to (e.g., passthrough relative to, non-signaling with) the memory array. In some embodiments, the semiconductor device assembly can further include one or more intermediary semiconductor devices with passthrough conductive columns bonded between the multiple intermediary semiconductor devices and the assembly substrate.

The semiconductor device assembly can be prepared by forming a plurality of intermediary devices, wherein each intermediary semiconductor device can have the memory array, the first bond pad, the second bond pad, and the passthrough conductive column. The plurality of intermediary devices can be directly bonded to the top semiconductor device and the assembly substrate can be directly bonded to each of the plurality of intermediary devices, electrically coupling the top semiconductor device and the assembly substrate via the first bond pad, the second bond pad, and the conductive column. A mold material can be provided between the multiple intermediary devices and an underfill material can be provided between the multiple intermediary devices and the assembly substrate. A mold material can also be provided over the top device and the multiple intermediary devices. Solder balls can then be formed on the assembly substrate opposite the multiple intermediary devices.

For ease of reference, the semiconductor device and other components are sometimes described herein with reference to top, bottom, left, right, lateral, vertical, uppermost, lowermost or other similar directional terms relative to the spatial orientation of the embodiments described and/or shown in the figures. The semiconductor devices described herein and modifications thereof can be moved to and/or used in different spatial orientations without changing the structure and/or function of the disclosed embodiments of the present technology.

FIG. 1 is a side view of a semiconductor device assembly 100 with multiple intermediary semiconductor devices 120 between a top assembly device 110 and an assembly substrate 130, and with a direct electric communication between the top device 110 and the assembly substrate 130 through the intermediary devices 120, configured in accordance with some embodiments of the present technology. The top device 110 can include direct electric communications with the assembly substrate 130 via through-substrate vias 126 (e.g., TSVs, conductive columns) extending through the intermediary devices 120. The top device 110 can be connected with the TSVs 126 at a surface bond between the top device 110 and the intermediary devices 120 via bond pads 112a of the top device 110 and bond pads 122a of the intermediary devices 120. The TSVs 126 can provide the direct electric communication between the top device 110 and the assembly substrate 130 by omitting connections with (e.g., bypassing, non-signaling, exclusive of connections with) electronic components of the intermediary devices 120. The top device 110 can also include direct electric communications with the intermediary devices 120 at the surface bond therebetween via bond pads 112b of the top device 110 and bond pads 122b of the intermediary devices 120. As used herein, conductive columns, TSVs, or other similar semiconductor device structures that bypass and/or are exclusive of electric connections with electronic components of a semiconductor device are referred to as "passthrough."

By providing direct electric communications within a device assembly between a top device and (i) an assembly substrate, via passthrough TSVs, and (ii) an intermediary device, via pad-pad connections, intermediary devices that otherwise would be spaced away from the top device to allow for direct connections between the top device and the assembly substrate can instead be stacked underneath the top device, eliminating interconnections therebetween and/or traces within a logic board or an interposer. Aspects of stacking intermediary devices under the top device of the device assembly provides many benefits including, for example, (i) improving signaling between the intermediary devices and the top device by reducing signaling distances, (ii) reducing material costs and assembly package size by removing unnecessary interposer or logic boards and the trace material therein, and (iii) further separating the top device, and the heat generated thereby, from the assembly substrate and any components thereat, and any components adjacent to the assembly.

As shown in FIG. 1, the assembly 100 can include the top device 110 and the intermediary devices 120 on the assembly substrate 130 and encased in a mold material 140. The assembly 100 can include the intermediary devices 120 surface-bonded (e.g., hybrid-bonded, face-to-face bonded) to the top device 110 and solder bonded to the assembly substrate 130 with solder balls 132. The assembly 100 can also include solder balls 134 at a bottom surface of the assembly substrate 130 for connecting the assembly 100 with additional components. Each intermediary device 120 can be laterally separated from other intermediary devices 120 by a mold material 128 to provide insulation and structural rigidity therebetween. The intermediary devices 120 can also be vertically separated from the assembly substrate 130 by an underfill material 136, similarly providing insulation and structural rigidity therebetween.

The top device 110 can be a processing device such as a graphics processing unit, a logic device, or other similar processing device, and can include the bond pads 112a, 112b in a bottom dielectric layer 114 and corresponding with I/O connections of the top device 110. Some bond pads 112a can be located vertically above intermediary device 120 bond pads 112a and passthrough TSVs 126 to provide the direct electric communication between the top device 110 and the assembly substrate 130. These direct connections can allow dedicated signaling, power, ground, or other similar electric communications between the top device 110 and the substrate 130, bypassing electronic components within the intermediary devices 120 and providing wider columns having greater maximum currents. Some bond pads 112b can be located vertically above intermediary device 120 bond pads 122b for the direct electric communication between the top device 110 and the intermediary devices 120. These connections can allow for signaling or other similar electric communications between the top device 110 and electric components of the intermediary devices 120.

The intermediary devices 120 can be memory devices such as memory dies or other similar semiconductor devices with internal electronic components, such as memory components and/or arrays, supporting functions of the top device 110. Each intermediary device 120 can include a semiconductor substrate 121 having some bond pads 122a corresponding with the passthrough TSV 126 in a top and a bottom dielectric layer 124 with the passthrough TSV 126 extending therebetween. Pairs of the bond pads 122a and the passthrough TSV 126 can correspond with and be located vertically under the top device 110 bond pads 112a for providing direct electric communications between the top device 110 and the assembly substrate 130. Each intermediary device 120 can also include some bond pads 122b corresponding with interconnections between the top device 110 and the intermediary device 120 in the top dielectric layer 124. These bond pads 122b can correspond with and be located vertically under the top device 110 bond pads 112b for providing direct electric communications between the top device 110 and the intermediary device 120 electric components.

As shown, the intermediary devices 120 include one pair of the bond pads 122a and the passthrough TSV 126, and two bond pads 122b. In some embodiments, one or more intermediary devices 120 can include additional pairs of bond pads 122a and passthrough TSVs 126 and/or additional bond pads 122b. Further, one or more intermediary devices 120 can include bond pads 122b in the bottom dielectric layer 124 for direct electric communication with the assembly substrate 130 or other components in electric communication thereat. For example, in some embodiments, one or more of the intermediary devices 120 can include as many as 1024 or more bond pads 122a, 122b in the top and/or bottom dielectric layers 124 for communicating with the top device 110, the assembly substrate 130, and/or other electric components.

Figure 2:
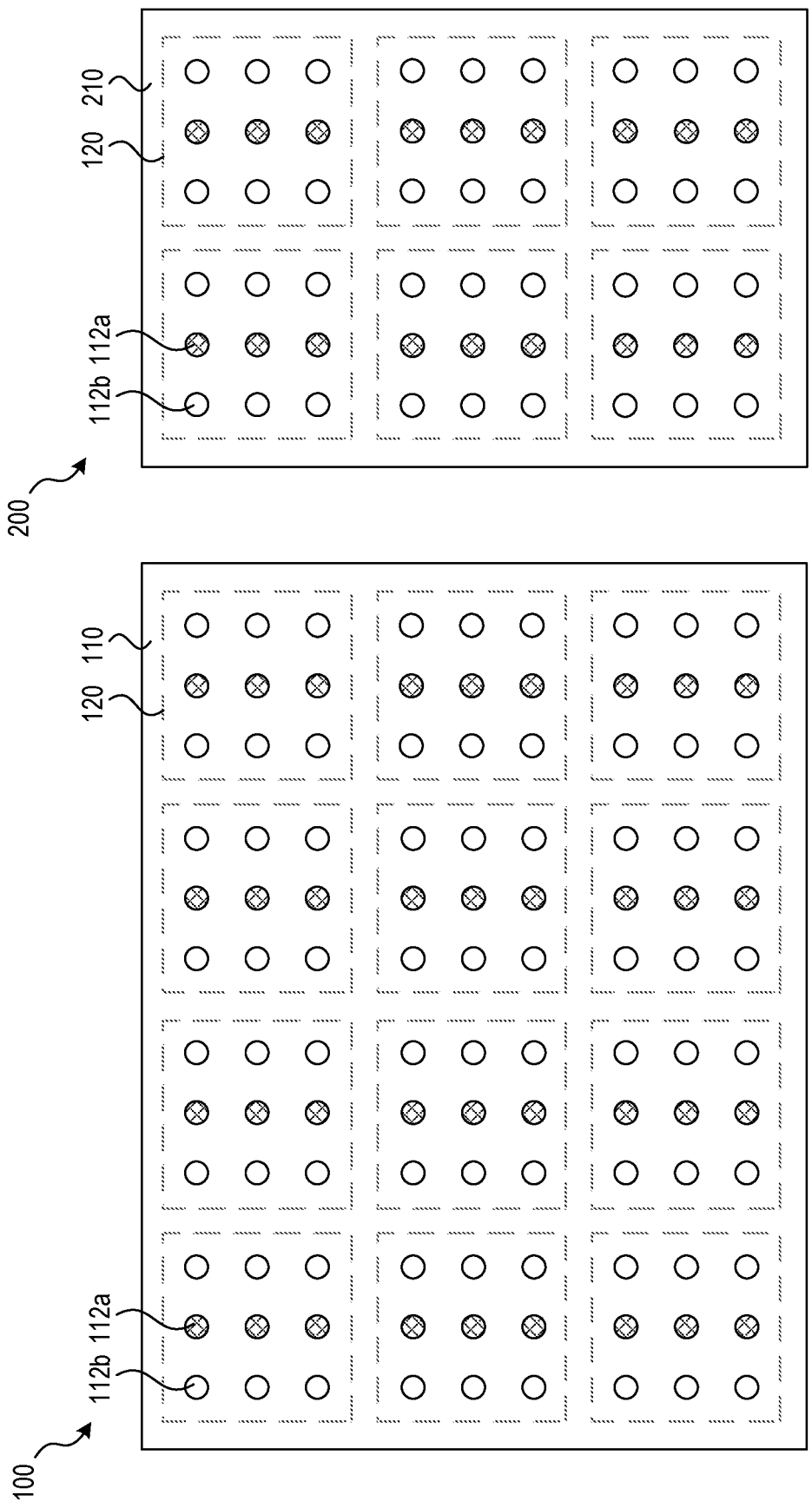
FIGS. 2A and 2B are cross sectional bottom views of semiconductor device assemblies, configured in accordance with some embodiments of the present technology.

FIG. 2A is a cross sectional bottom view of the assembly 100 at the bond between the top device 110 and the intermediary devices 120 configured in accordance with some embodiments of the present technology. Specifically, FIG. 2A is the cross section view A-A of FIG. 1. In FIG. 2A, the surface bond locations of the intermediary devices 120 on the top device 110 are shown as dashed lines and the mold material 140 is omitted for ease of reference and illustration. As shown, the top device 110 includes one hundred eight bond pads 112a, 112b corresponding with and located above twelve intermediary dies 120. In some embodiments, the assembly 100 can include fewer (e.g., 1, 2, 4 in total) or additional (e.g., 16, 24 in total) intermediary devices 120 per top device 110. FIG. 2B illustrates an example semiconductor device assembly 200 including fewer intermediary devices 120. FIG. 2B is a cross sectional bottom view of the assembly 200 at the surface bond between a top device 210 and the intermediary devices 120 configured in accordance with some embodiments of the present technology. The assembly 200 and the components thereof are generally similar to the assembly 100, however, the top device 210 is smaller than the top device 110 of FIGS. 1 and 2A. The assembly 200 of FIG. 2B also includes fewer intermediary devices 120 bonded to the top device 210. As illustrated, the assembly 200 includes six intermediary devices 120.

Regarding FIGS. 2A and 2B, the top devices 110, 210 include (i) three bond pads 112a corresponding with intermediary device 120 bond pads 122a for direct electric communication with the assembly substrate 130, and (ii) six bond pads 112b correspond with intermediary device 120 bond pads 122b for direct electric communication with the intermediary devices 120 electronic components. In some embodiments, the top devices 110, 210 can include as many as 1024 or more bond pads 112a, 112b per intermediary device 120. In some embodiments, for each intermediary device 120, the top devices 110, 210 can include different proportions of bond pads 112a for communication with the assembly substrate 130 versus bond pads 112b for communication with the intermediary devices 120. For example, the top devices 110, 210 can include as few as one bond pad 112a for direct electric communication with the assembly substrate 130 per intermediary device 120. Additionally or alternatively, the top devices 110, 210 can include one or more bond pads 112a for direct electric communication with the assembly substrate 130 for only select (e.g., one or more, less than all) intermediary devices 120. For example, the top devices 110, 210 can include bond pads 112a for direct electric communication with the assembly substrate 130 through only one intermediary device 120. Similarly, in some embodiments, the top devices 110, 210 can include as few as one bond pad 112b for communication with each intermediary device 120, and/or the top devices 110, 210 can include one or more bond pads 112b for communication with only select (e.g., one or more, less than all) intermediary devices 120.

Figure 3:
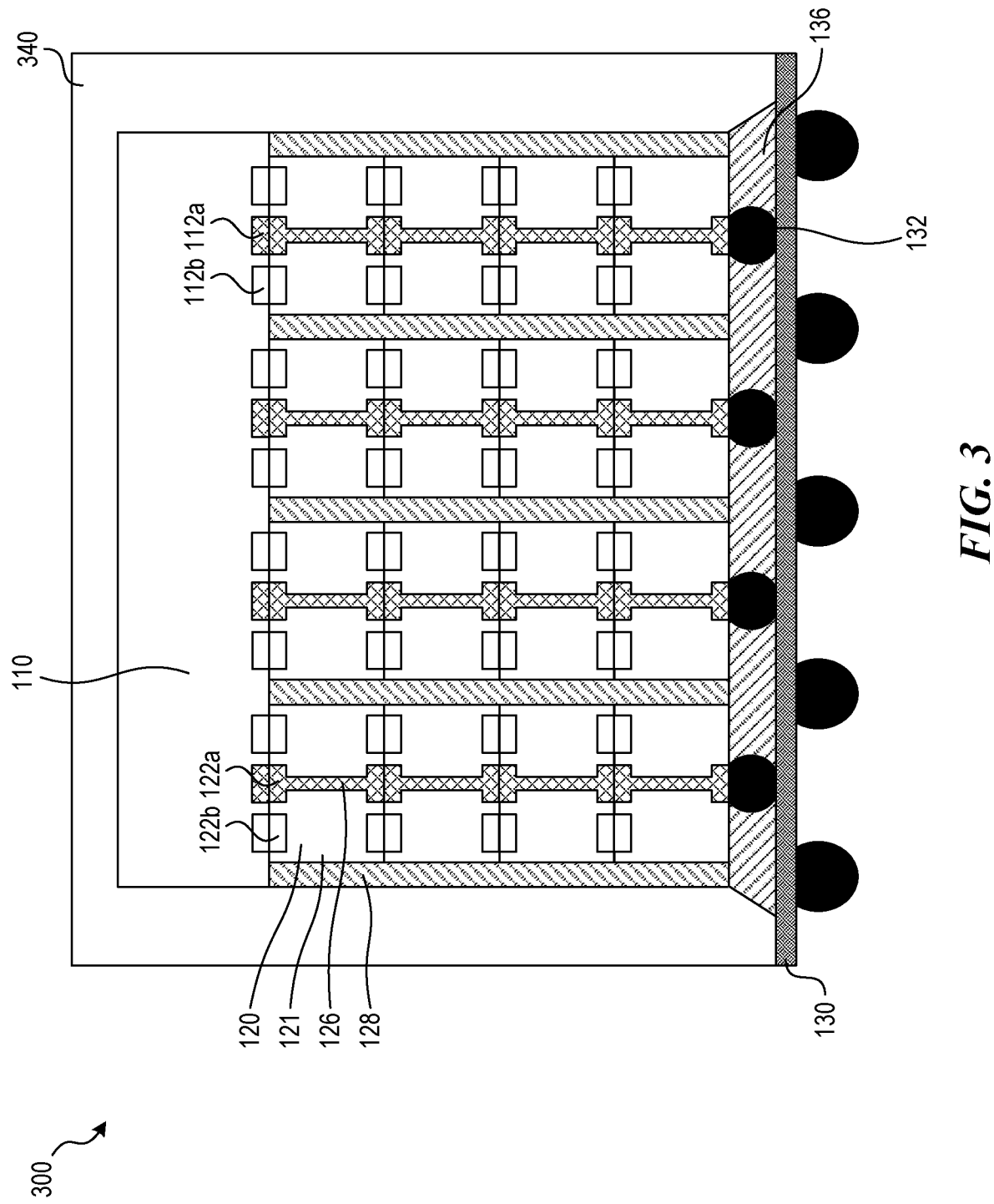
FIG. 3 is a cross sectional side view of a semiconductor device assembly, configured in accordance with some embodiments of the present technology.

FIG. 3 is a cross sectional side view of a semiconductor device assembly 300 with multiple, stacked intermediary devices 120 between the top device 110 and the assembly substrate 130, and with a direct electric communication between the top device 110 and the assembly substrate 130 through the intermediary devices 120, configured in accordance with some embodiments of the present technology. Dielectric layers 114, 124, of the top device 110 and the intermediary devices 120 as previously shown in FIG. 1 are omitted in FIG. 3 for ease of reference and illustration. As shown in FIG. 3, the assembly 300 includes four stacks of four intermediary devices 120 between the top device 110 and the assembly substrate 130 encased in a mold material 340. The stacked intermediary devices 120 can be surface-bonded to vertically adjacent intermediary devices 120 with bond pads 122a and passthrough TSVs 126 pairs of each intermediary device 120 in vertical alignment. The aligned bond pads 122a and passthrough TSV 126 pairs can provide a direct electric communication between the top device 110 and the assembly substrate 130. Stacked intermediary devices 120 can also include direct electric communications at the surface bond therebetween via bond pads 122b, providing electric communications between the intermediary devices 120 electronic components. These intermediary-device-to-intermediary-device connections can also provide electric communications between the top device 110 and the intermediary devices 120 not surface-bonded therewith via internal traces or electronic components of the intermediary devices 120 therebetween.

The stacked intermediary devices 120 can be laterally separated by the mold material 128 to provide insulation and structural rigidity therebetween. Lowermost intermediary devices 120 of an intermediary device 120 stack can be vertically separated from the assembly substrate 130 by the underfill material 136, similarly providing insulation and structural rigidity therebetween. Although as illustrated in FIG. 3, the assembly 300 includes four intermediary devices 120 per intermediary device 120 stack, in some embodiments, the assembly 300 can include fewer (e.g., 2, 3) or additional (e.g., 5, 6) intermediary devices 120 per stack. Regarding bond pads, one or more lowermost intermediary devices 120 can include bond pads 122*b* in the bottom dielectric layer for direct electric communication with the assembly substrate 130 and/or other components in electric communication thereat.

Figure 4:
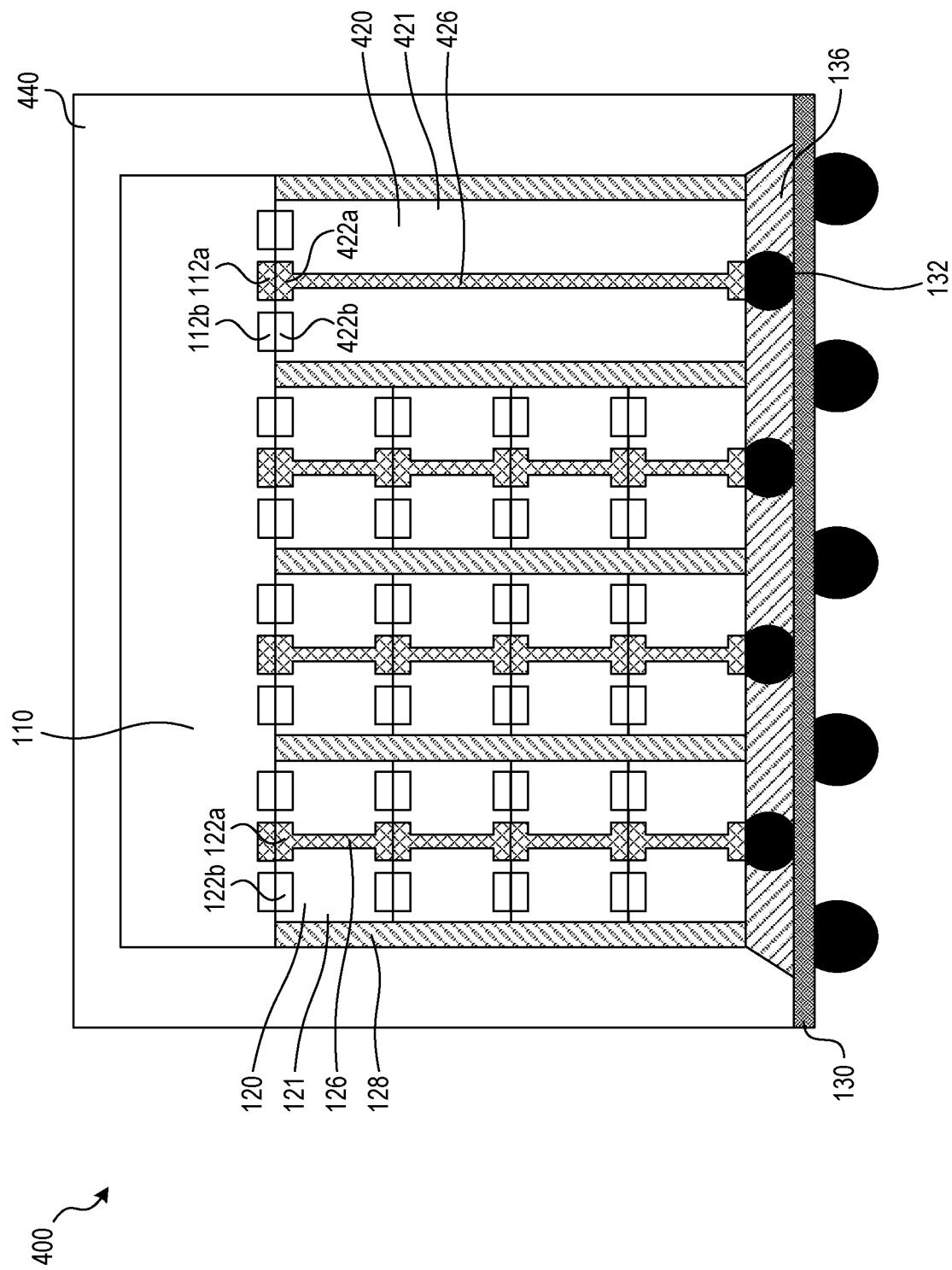
FIG. 4 is a cross sectional side view of a semiconductor device assembly, configured in accordance with some embodiments of the present technology.

FIG. 4 is a cross sectional side view of a semiconductor device assembly 400 generally similar to the assembly 300 with multiple, stacked intermediary devices 120 and a thick intermediary semiconductor device 420 between the top device 110 and the assembly substrate 130, and with a direct electric communication between the top device 110 and the assembly substrate 130 through the intermediary devices 120 and the thick intermediary device 420, configured in accordance with some embodiments of the present technology. Dielectric layers 114, 124, of the top device 110 and the intermediary devices 120 as previously shown in FIG. 1, and dielectric layers of the thick intermediary devices 420 are omitted in FIG. 4 for ease of reference and illustration. As shown in FIG. 4, the assembly 400 includes three stacks of four intermediary devices 120 and one thick intermediary device 420 between the top device 110 and the assembly substrate 130 encased in a mold material 440. The stacked intermediary devices 120 can be generally similar or the same as the stacked intermediary devices 120 illustrated in FIG. 3.

The thick intermediary device 420 can generally be a thick intermediary device 120 including the same and/or similar components with the same or similar height as the stacked intermediary devices 120. For example, the thick intermediary device 420 can be a memory device such as a memory die or other similar semiconductor device supporting functions of the top device 110. The thick intermediary device 420 can include a semiconductor substrate 421 having some bond pads 422*a* in a top and a bottom dielectric layer with a passthrough TSV 426 extending therebetween. These bond pads 422*a* and the passthrough TSV 426 pairs can correspond with and be located vertically under the top device 110 bond pads 112*a* for communicating with the assembly substrate 130. The thick intermediary device 420 can also include some bond pads 422*b* in the top dielectric layer and in connection with electric components of the thick intermediary device 420. These bond pads 422*b* can correspond with and be located vertically under the top device 110 bond pads 112*b* for communicating directly with the electric components of the thick intermediary device 420.

The stacked intermediary devices 120 and the thick intermediary device 420 can be laterally separated by the mold material 128 to provide insulation and structural rigidity therebetween. Lowermost intermediary devices 120 of an intermediary device 120 stack and the thick intermediary device 420 can be vertically separated from the assembly substrate 130 by the underfill material 136, similarly providing insulation and structural rigidity therebetween. Although as illustrated in FIG. 4, the assembly 400 includes one thick intermediary device 420, in some embodiments, the assembly 400 can include two or more thick intermediary devices 420. Similarly, although the assembly 400 includes four intermediary devices 120 per intermediary device 120 stack, in some embodiments, the assembly 400 can include fewer (e.g., 2, 3) or additional (e.g., 5, 6) intermediary devices 120 per stack and one or more shorter or taller thick intermediary device 420. Regarding bond pads, in some embodiments, one or more thick intermediary devices 420 can include additional pairs of bond pads 422*a* and passthrough TSVs 426 and/or additional bond pads 422*b*. Further, one or more thick intermediary devices 420 can include bond pads 422*b* in the bottom dielectric layer for direct electric communication with the assembly substrate 130 and/or other components in electric communication thereat. For example, in some embodiments, one or more thick intermediary devices 420 can include as many as 1024 or more bond pads 422*a*, 422*b* in the top and/or bottom dielectric layers.

Figure 8:
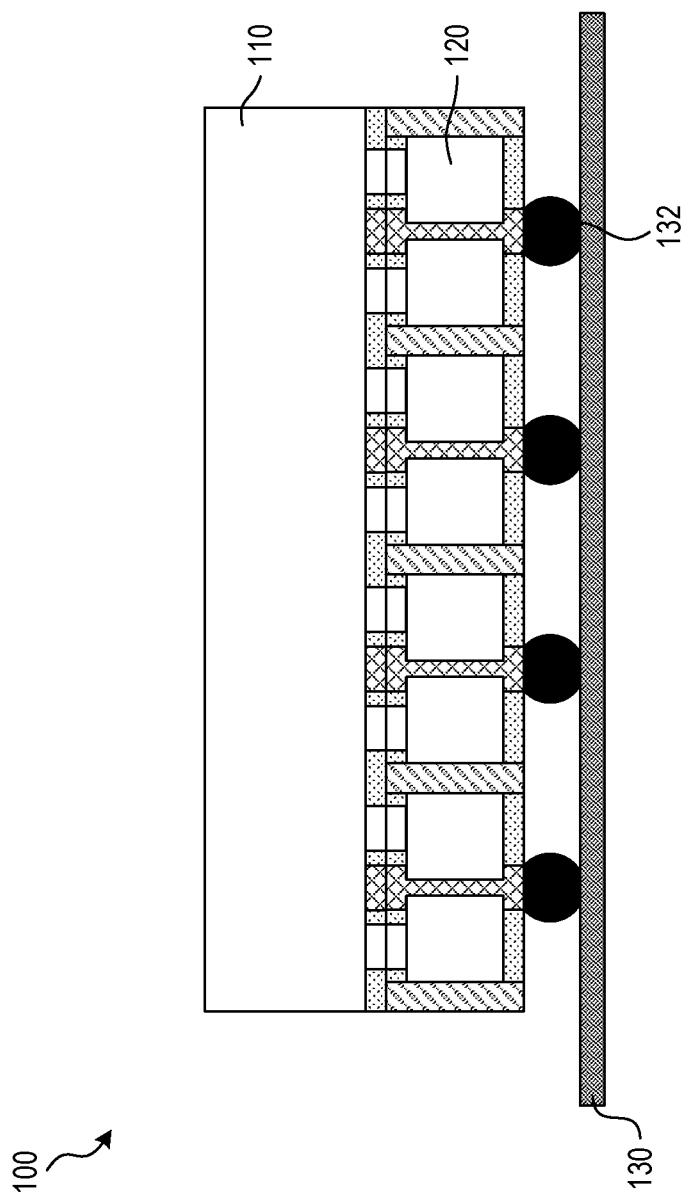
Figure 9:
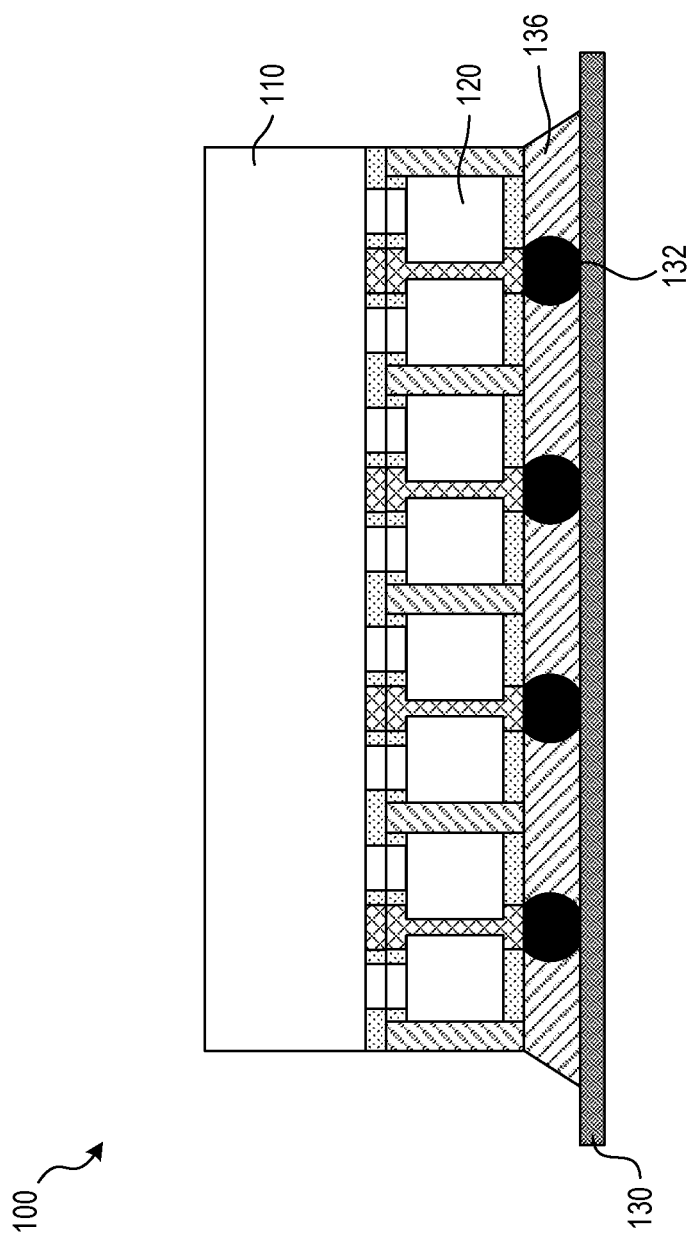
Figure 10:
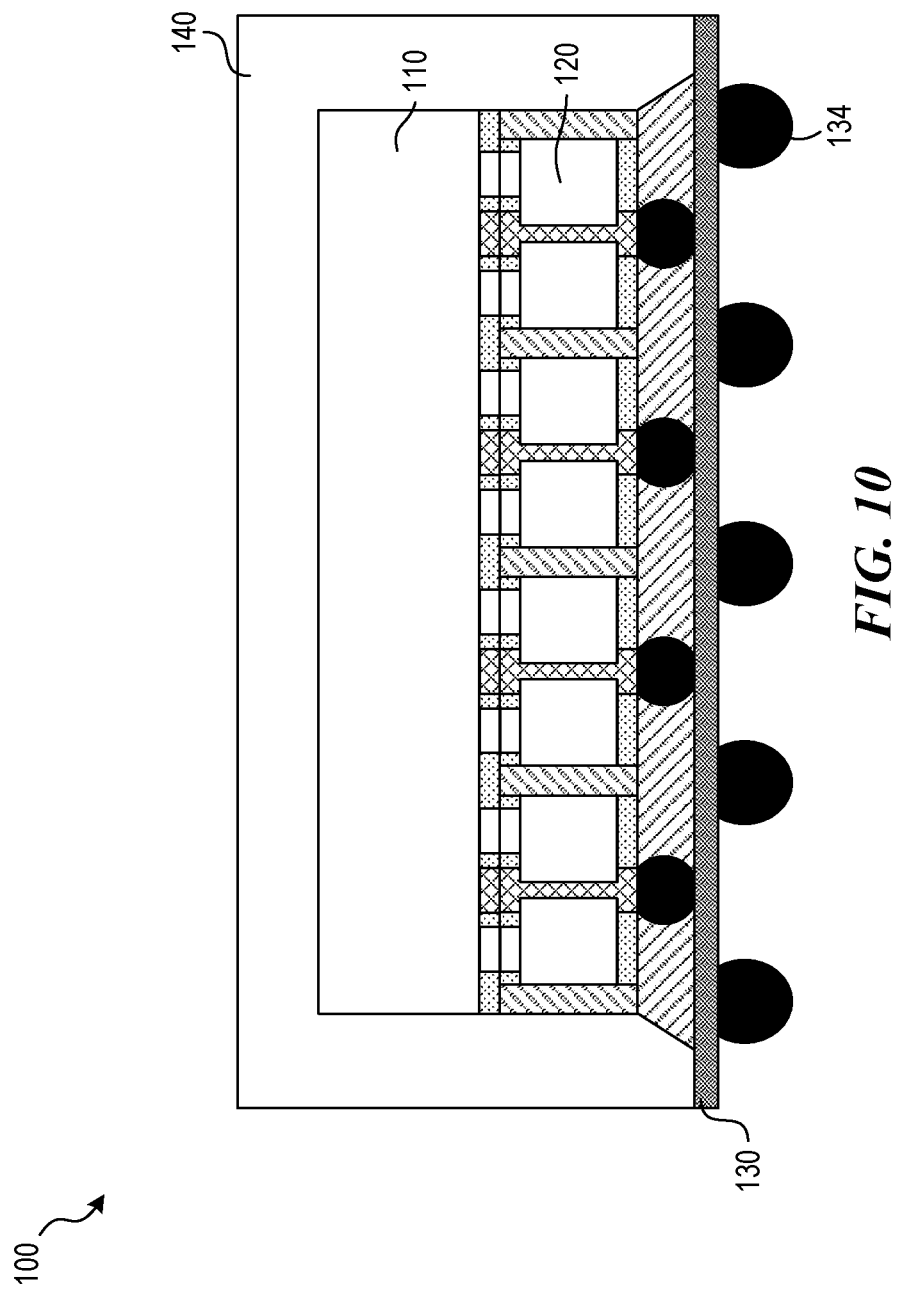

FIGS. 5-10 illustrate a process for producing at least the assembly 100 of FIG. 1 with the intermediary devices 120 between the top device 110 and the assembly substrate 130 in accordance with some embodiments of the present technology. The process may generally include forming the intermediary devices 120 (FIG. 5), singulating and surface-bonding the intermediary devices 120 to the top device 110 (FIG. 6), providing a mold material 128 between the intermediary devices 120 (FIG. 7), solder bonding the top device 110 and the intermediary devices 120 sub-assembly to the assembly substrate 130 (FIG. 8), providing an underfill material 136 between the intermediary devices 120 and the assembly substrate 130 (FIG. 9), and providing a mold material 140 over the top device 110 and the intermediary devices 120, and forming solder balls 134 on the assembly substrate 130 (FIG. 10).

Figure 5:
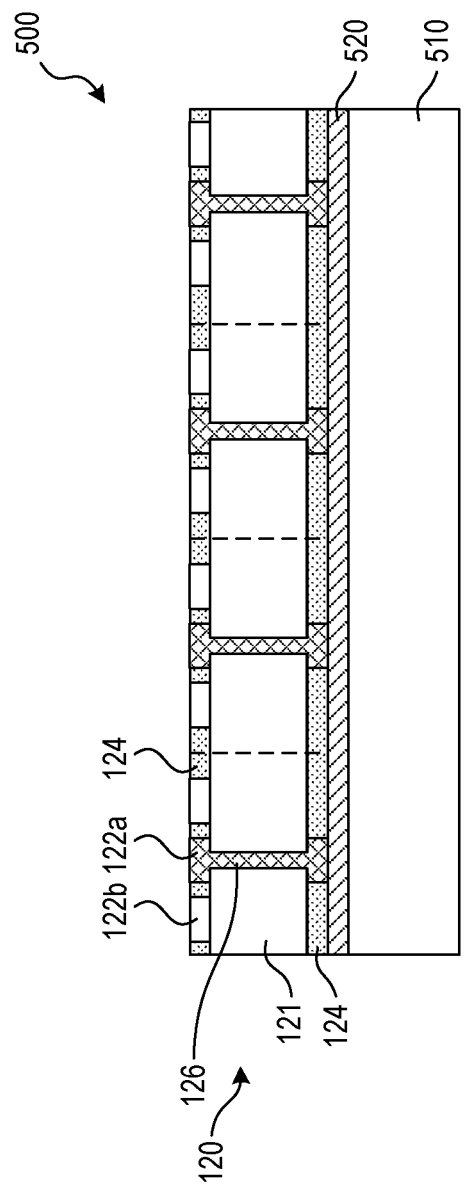
FIGS. 5-10 illustrate a process for producing at least the semiconductor device assembly of FIG. 1, in accordance with some embodiments of the present technology.

FIG. 5 illustrates forming the intermediary devices 120. Forming the intermediary devices 120 can include using an additive manufacturing process to form a device wafer 500 adhered to a carrier wafer 510 with an adhesive 520. The device wafer 500 can include the semiconductor substrate 121, the bond pads 122*a*, 122*b*, the dielectric layers 124, the passthrough TSVs 126, and any other electronic components on or within the intermediary devices 120 spaced for later singulation along the illustrated dashed lines. The additive process can include any additive process such as, for example, plaiting, depositing, and/or another suitable process in combination with intermediary etching or removal steps.

Figure 6:
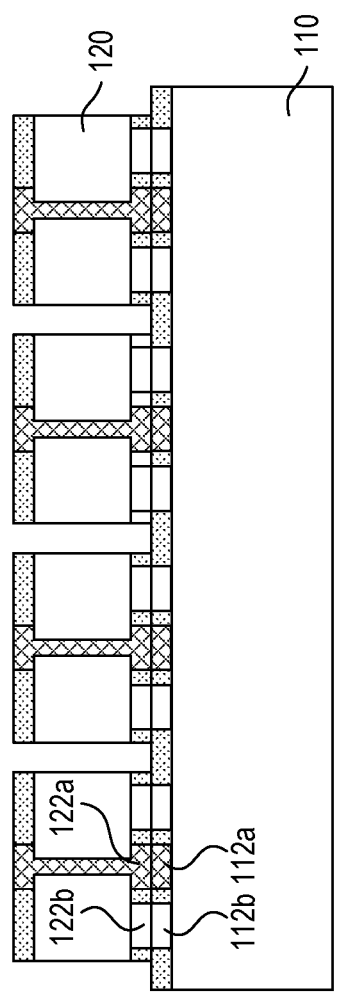

FIG. 6 illustrates the assembly 100 after singulating the intermediary devices 120 from the device wafer 500 and surface-bonding the intermediary devices 120 to the top device 110. Singulating can include separating the intermediary devices 120 of the device wafer 500 using plasma dicing, laser stealth dicing, or mechanism cutting or scoring, or any suitable method for separating the intermediary devices 120 from the device wafer 500. The singulated intermediary devices 120 can then be surface-bonded (e.g., hybrid-bonded, face-to-face bonded) to the top device 110 with (i) bond pads 112*a*, 122*a* for communication between the top device 110 and the assembly substrate 130 (FIG. 1) in vertical alignment, and (ii) bond pads 112*b*, 122*b* for communication between the top device 110 and the intermediary devices 120 in vertical alignment.

Figure 7:
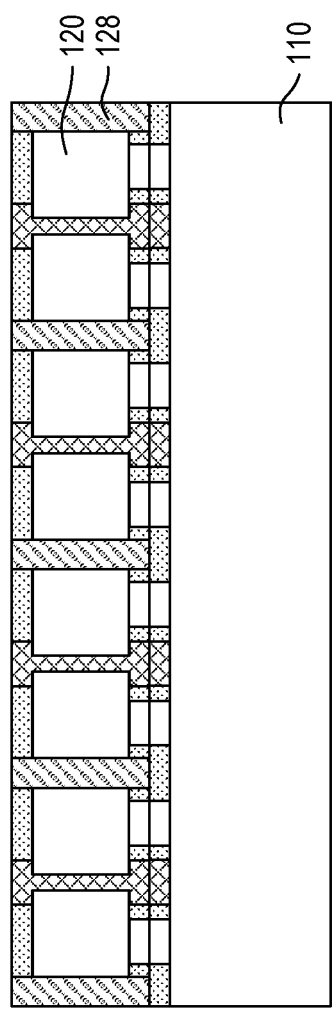

FIG. 7 illustrates the assembly 100 after the mold material 128 is provided between the intermediary devices 120. The mold material 128 can be provided by dipping the assembly 100 of FIG. 6 into a liquid molding material, removing the assembly 100 from the liquid molding material, and allowing the molding material to harden. In some embodiments, the molding material may be provided by pouring the material over the assembly 100 as oriented in FIG. 6. Once hardened, excess mold material 128 can be etched from the assembly 100, as shown in FIG. 7. The mold material 128 can increase assembly 100 rigidity and protect the assembly 100 from contaminants, such as particles or liquids, between the intermediary devices 120.

FIG. 8 illustrates solder bonding the top device 110 and the intermediary devices 120 sub-assembly to the assembly substrate 130. The sub-assembly can be solder bonded to the assembly substrate 130 by forming solder balls 132 on the intermediary devices 120 and/or on the assembly substrate 130, placing the intermediary devices 120 adjacent to the assembly substrate 130, and performing a reflow operating to form solder joints between the intermediary devices 120 and the assembly substrate 130. The solder balls 132 can be formed using any suitable additive process such as plaiting, depositing, or similar process.

FIG. 9 illustrates the assembly 100 after the underfill material 136 is provided between the intermediary devices 120 and the assembly substrate 130. The underfill material 136 can be injected in a gap created by the solder balls 132 between the intermediary devices 120 and the assembly substrate 130. The underfill material 136 can increase solder joint strength between the intermediary devices 120 and the assembly substrate 130, as well as strengthen overall assembly 100 rigidity and protect the assembly 100 from contaminants between the intermediary devices 120 and the assembly substrate 130.

FIG. 10 illustrates the assembly 100 after the mold material 140 is provided over the top device 110 and the intermediary devices 120, and after solder balls 134 are formed on the assembly substrate 130. The mold material 136 can be provided by dipping the assembly 100 of FIG. 9 into a liquid molding material, removing the assembly 100 from the liquid molding material, and allowing the molding material to harden. In some embodiments, the molding material may be provided by pouring the material over the assembly 100 as oriented in FIG. 9. Once hardened, excess mold material 136 can be etched from the assembly 100, as shown in FIG. 9. The mold material 140 can increase assembly 100 rigidity and protect the assembly 100 from contaminants. The solder balls 134 can be formed on a bottom surface of the assembly substrate 130 by using any suitable additive process such as plaiting, depositing, or similar process.

FIG. 11 is a flow diagram illustrate a process 1100 for producing at least the assembly 100 of FIG. 1 with the intermediary devices 120 between the top device 110 and the assembly substrate 130, and with a direct electric communication between the top device 110 and the assembly substrate 130 through the intermediary devices 120, in accordance with some embodiments of the present technology. The operations of process 1100 are intended for illustrative purposes and are non-limiting. In some embodiments, for example, the process 1100 can be accomplished with one or more additional operations not described, without one or more of the operation described, or with operations described and/or not described in an alternative order. As shown in FIG. 11, the process may include: forming a plurality of intermediary semiconductor devices (process portion 1102), bonding the intermediary semiconductor devices to a top semiconductor device (process portion 1104), providing a mold material between the intermediary semiconductor devices (process portion 1106), solder bonding the intermediary semiconductor devices to an assembly substrate (process portion 1108), providing an underfill material between the intermediary semiconductor devices and the assembly substrate (process portion 1110), providing a mold material over the intermediary semiconductor devices and the top semiconductor device (process portion 1112), and forming solder balls on the assembly substrate (process portion 1114).

In some embodiments, one or more portions of the process 1100 can be completed by one or more actors. For example, a first actor can complete process portion 1102, a second actor can complete operations 1104-1112, and a third actor can complete operations 1114, or any other combination of actors. In these embodiments, the second actor can receive one or more prepared semiconductor devices for bonding to the top device (e.g., the second actor can receive a plurality of intermediary semiconductor devices prepared by the first actor), or the third actor can receive one or more partially-prepared semiconductor device assemblies for testing, for solder balls thereon, etc.

In process portion 1102, the plurality of intermediary semiconductor devices can be formed. The intermediary semiconductor devices can be formed within a device wafer on a carrier wafer, and singulated from the device wafer thereafter. The device wafer can be formed by using an additive manufacturing process to form portions of the intermediary semiconductor devices, including, for example, a semiconductor substrate, bond pads, dielectric layers, passthrough TSVs, and other electronic components on or within the intermediary semiconductor devices. The additive process can include any additive process such as, for example, plaiting, depositing, and/or another suitable process in combination with intermediary etching or removal steps. The intermediary semiconductor devices can be singulated from the device wafer using plasma dicing, laser stealth dicing, or mechanism cutting or scoring, or any suitable method for separating the intermediary semiconductor devices.

In process portion 1104, each of the intermediary semiconductor devices can be bonded to the top semiconductor device. The intermediary semiconductor devices can be surface-bonded (e.g., hybrid bonded, face-to-face bonded) by vertically aligning bond pads of the intermediary semiconductor devices and the top semiconductor device, respectively, and pressing a surface of each intermediary semiconductor device against a surface of the top semiconductor device.

In process portion 1106, a mold material can be provided between the intermediary semiconductor devices. The mold material can be provided by dipping the intermediary semiconductor devices bonded to the top semiconductor device into a liquid molding material, removing the intermediary semiconductor devices from the liquid molding material, and allowing the molding material to harden. In some embodiments, the molding material may be provided by pouring the material over the intermediary semiconductor devices.

In process portion 1108, the assembly substrate can be bonded to the plurality of intermediary semiconductor devices. The assembly substrate can be solder bonded to the plurality of intermediary semiconductor devices by forming solder balls on the intermediary semiconductor devices and/or on the assembly substrate, placing the intermediary semiconductor devices adjacent to the assembly substrate, and performing a reflow operating to form solder joints between the intermediary semiconductor devices and the assembly substrate. The solder balls can be formed using any suitable additive process such as plaiting, depositing, or similar process.

In process portion 1110, an underfill material can be provided between the intermediary semiconductor devices and the assembly substrate. The underfill material can be provided by injecting the material in a gap created by the solder balls between the intermediary semiconductor devices and the assembly substrate.

In process portion 1112, a mold material can be provided over the intermediary semiconductor devices and the top semiconductor device. The mold material can be provided by dipping the intermediary semiconductor devices and the top semiconductor device into a liquid molding material, removing the intermediary semiconductor devices and the top semiconductor device from the liquid molding material, and allowing the molding material to harden. In some embodiments, the molding material may be provided by pouring the material over the intermediary semiconductor devices and the top semiconductor device.

In process portion 1114, solder balls can be formed on a bottom surface of the assembly substrate. The solder balls can be formed using any suitable additive process such as plaiting, depositing, or similar process.

When producing semiconductor device assemblies with multiple (e.g., stacked) intermediary semiconductor devices, such as the assembly 300 of FIG. 3 or the assembly 400 of FIG. 4 with the thick intermediary device 420, process portions 1102 through 1106 of FIG. 11 can be completed first to form a sub-assembly including the top semiconductor device and the intermediary semiconductor devices laterally spaced by the mold material. Then, process portions 1104 and 1106 can be selectively repeated (e.g., one, twice, etc.) with the singulated intermediary semiconductor devices at process portion 1104 surface-bonded to the preceding intermediary semiconductor devices, instead of the top semiconductor device, and mold material provided therebetween at process portion 1106. When the assembly includes the thick intermediary semiconductor devices, once the intermediary semiconductor devices are stacked to equal the height of the thick intermediary semiconductor devices, the thick intermediary semiconductor device can be bonded to the top semiconductor device laterally adjacent to the stacked intermediary semiconductor devices and process portions 1108 through 1114 can be performed to complete the assembly. When the assembly does not include the thick intermediary semiconductor devices, once the desired number of intermediary semiconductor devices are stacked and bonded to the assembly, process portions 1108 through 1114 can be performed to complete the assembly.

Figure 12:
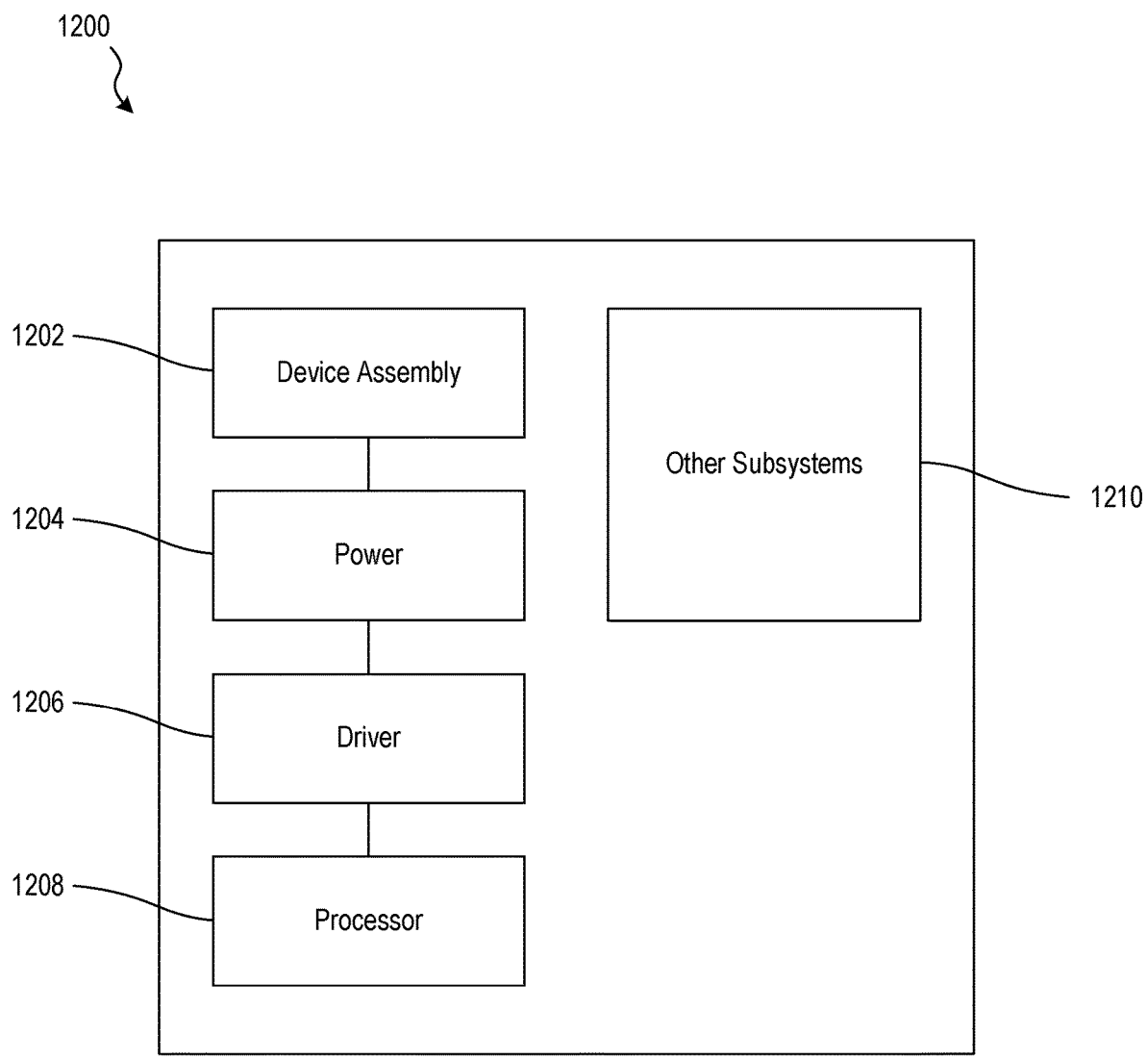
FIG. 12 is a schematic diagram illustrating a semiconductor device assembly incorporating the present technology, configured in accordance with some embodiments of the present technology.

Any one of the semiconductor devices and/or semiconductor device assemblies described above with reference to FIGS. 1-11 can be incorporated into any of a myriad of larger and/or more complex systems, a representative example of which is system 1200 shown schematically in FIG. 12. The system 1200 can include a semiconductor device assembly 1202 (e.g., the assembly 100 of FIG. 1, the assembly 200 of FIG. 2B, the assembly 300 of FIG. 3, and/or the assembly 400 of FIG. 4), a power source 1204, a driver 1206, a processor 1208, and/or other subsystems or components 1210. The semiconductor device assembly 1202 can include features generally similar to those of the semiconductor devices and assemblies described above with reference to FIGS. 1-11. The resulting system 1200 can perform any of a wide variety of functions, such as memory storage, data processing, or other suitable functions. Accordingly, representative systems 1200 can include, without limitation, hand-held devices (e.g., mobile phones, tablets, digital readers, and digital audio players), computers, vehicles, appliances and other products. Components of the system 1200 may be housed in a single unit or distributed over multiple, interconnected units (e.g., through a communications network). The components of the system 1200 can also include remote devices and any of a wide variety of computer readable media.

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms may also include the plural or singular term, respectively. The terms "comprising," "including," "having," and "with" are used throughout to mean including at least the recited feature(s) such that any greater number of the same features and/or additional types of other features are not precluded. Similarly, use of the word "some" is defined to mean both "at least one" of the relevant features and/or elements.

As used herein, including in the claims, "or" as used in a list of items (for example, a list of items prefaced by a phrase such as "at least one of" or "one or more of") indicates an inclusive list such that, for example, a list of at least one of A, B, or C means: A or B or C; or AB or AC or BC; or ABC (i.e., A and B and C). As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation. It should be noted that the methods described above describe possible implementations, and that the operations and the steps may be rearranged or otherwise modified and that other implementations are possible. Furthermore, embodiments from two or more of the methods may be combined.

From the foregoing, it will also be appreciated that various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:
1. A semiconductor device assembly, comprising:
an assembly substrate including a top surface;
a top semiconductor device including a bottom surface; and
a plurality of intermediary semiconductor devices, each bonded to both the assembly substrate top surface and to the top semiconductor device bottom surface, wherein each intermediary semiconductor device includes:
a memory array,
a first bond pad electrically coupling the intermediary semiconductor device to the assembly substrate,
a second bond pad electrically coupling the intermediary semiconductor device to the top semiconductor device, and
a passthrough conductive column extending through a semiconductor substrate of the intermediary semiconductor device from the first bond pad to the second bond pad, and exclusive of any electrical connection to the memory array.

2. The semiconductor device assembly of claim 1, wherein the top semiconductor device further includes a bypass bond pad at the bottom surface electrically coupled to the assembly substrate via the second bond pad, the passthrough conductive column, and the first bond pad of one of the plurality of intermediary semiconductor devices.

3. The semiconductor device assembly of claim 1, wherein the top semiconductor device further includes an intermediary bond pad at the bottom surface, wherein one of the plurality of intermediary semiconductor devices further includes a third bond pad electrically coupled to the intermediary bond pad, and wherein the top semiconductor device is electrically coupled to the memory array of the one of the plurality of intermediary semiconductor devices via the intermediary bond pad and the third bond pad.

4. The semiconductor device assembly of claim 1, wherein the plurality of intermediary semiconductor devices are hybrid-bonded to the top semiconductor device.

5. The semiconductor device assembly of claim 1, wherein the plurality of intermediary semiconductor devices are solder-bonded to the assembly substrate.

6. The semiconductor device assembly of claim 1 further comprising a mold material over the top surface of the assembly substrate and encasing the top semiconductor device and the plurality of intermediary semiconductor devices.

7. The semiconductor device assembly of claim 1 further comprising a mold material between the plurality of intermediary semiconductor devices.

8. The semiconductor device assembly of claim 1 further comprising an underfill material between the plurality of intermediary semiconductor devices and the assembly substrate.

9. A semiconductor device assembly, comprising:
a top semiconductor device including a bottom surface; and
a plurality of intermediary semiconductor devices, each bonded to the bottom surface, wherein each intermediary semiconductor device includes:
a memory array,
a first bond pad electrically coupled to the top semiconductor device,
a second bond pad opposite the first bond pad, and
a passthrough conductive column extending through a semiconductor substrate of the intermediary semiconductor device from the first bond pad to the second bond pad, and exclusive of any electrical connection to the memory array.

10. The semiconductor device assembly of claim 9 further comprising:
a plurality of second intermediary semiconductor devices, wherein each second intermediary semiconductor device is bonded to one of the plurality of intermediary semiconductor devices, and wherein each second intermediary semiconductor device includes:
a memory array,
a third bond pad electrically coupled to the top semiconductor device via the first bond pad, the second bond pad, and the passthrough conductive column,
a fourth bond pad opposite the third bond pad, and
a second passthrough conductive column extending through a semiconductor substrate of the second intermediary semiconductor device from the third bond pad to the fourth bond pad, and exclusive of any electrical connection to the memory array of the second intermediary semiconductor device.

11. The semiconductor device assembly of claim 10 further comprising an assembly substrate bonded to the plurality of second intermediary semiconductor devices opposite the bonds between the plurality of intermediary semiconductor devices and the plurality of second intermediary semiconductor devices.

12. The semiconductor device assembly of claim 10, wherein one of the plurality of intermediary semiconductor devices and the second intermediary semiconductor device bonded thereto each further include an inter-device bond pad electrically coupling the memory array of the one of the plurality of intermediary semiconductor devices to the memory array of the second intermediary semiconductor device bonded thereto.

13. The semiconductor device assembly of claim 12, wherein the top semiconductor device further includes an intermediary bond pad at the bottom surface, wherein the one of the plurality of intermediary semiconductor devices further includes a top bond pad, and wherein the intermediary bond pad and the top bond pad electrically couple the top semiconductor device to the memory array of the second intermediary semiconductor device bonded to the one of the plurality of intermediary semiconductor devices via the memory array of the one of the plurality of intermediary semiconductor device and the inter-device bond pads.

14. The semiconductor device assembly of claim 9, wherein the plurality of intermediary semiconductor devices are hybrid-bonded to the top semiconductor device.

15. The semiconductor device assembly of claim 10, wherein each of the plurality of second intermediary semiconductor devices is hybrid-bonded to the one of the plurality of intermediary semiconductor devices.

16. The semiconductor device assembly of claim 11, wherein the assembly substrate is solder-bonded to the plurality of second intermediary semiconductor devices.

17. The semiconductor device assembly of claims 11 further comprising a mold material over a top surface of the assembly substrate and encasing the top semiconductor device, the plurality of intermediary semiconductor devices, and the plurality of second intermediary semiconductor devices.

18. A method of manufacturing a semiconductor device assembly, comprising:
forming a plurality of intermediary semiconductor devices, wherein each intermediary semiconductor device includes:
a memory array,
a first bond pad at a first surface of the intermediary semiconductor device,
a second bond pad at a second surface of the intermediary semiconductor device opposite the first surface, and
a passthrough conductive column extending through a semiconductor substrate of the intermediary semiconductor device from the first bond pad to the second bond pad, and exclusive of any electrical connection to the memory array;

bonding each of the plurality of the intermediary semiconductor devices directly to a top semiconductor device; and bonding an assembly substrate directly to each of the plurality of intermediary semiconductor devices, electrically coupling the top semiconductor device to the assembly substrate via the first bond pads, the second bond pads, and the passthrough conductive columns.

19. The method of claim 18 further comprising:

providing mold material between the intermediary semiconductor devices after bonding each of the intermediary semiconductor devices directly to the top semiconductor device and before bonding the assembly substrate directly to each of the intermediary semiconductor devices;

providing an underfill material between the intermediary semiconductor devices and the assembly substrate after bonding the assembly substrate to each of the intermediary semiconductor devices; and providing a mold material over the intermediary semiconductor devices and the top semiconductor device.

20. The method of claim 18 further comprising forming solder balls on the assembly substrate.

* * * * *